United States Patent
Koizumi et al.

(10) Patent No.: US 9,553,252 B2
(45) Date of Patent: Jan. 24, 2017

(54) PIEZOELECTRIC/ELECTROSTRICTIVE FILM TYPE ELEMENT CONTAINING LEAD ZIRCONATE TITANATE AND A BISMUTH COMPOUND AND METHOD FOR PRODUCING THE SAME

(71) Applicant: NGK Insulators, Ltd., Nagoya-Shi (JP)

(72) Inventors: Takaaki Koizumi, Tajima (JP); Tomohiko Hibino, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 208 days.

(21) Appl. No.: 14/499,598

(22) Filed: Sep. 29, 2014

(65) Prior Publication Data

US 2015/0015122 A1    Jan. 15, 2015

Related U.S. Application Data

(63) Continuation of application No. PCT/JP2013/059176, filed on Mar. 28, 2013.

(30) Foreign Application Priority Data

Mar. 30, 2012    (JP) ................................ 2012-079467

(51) Int. Cl.
*H01L 41/18* (2006.01)
*H01L 41/187* (2006.01)
(Continued)

(52) U.S. Cl.
CPC ........... *H01L 41/1876* (2013.01); *B32B 18/00* (2013.01); *B41J 2/14233* (2013.01); *B41J 2/161* (2013.01);
(Continued)

(58) Field of Classification Search
CPC ........................... H01L 41/1876; H01L 41/047
(Continued)

(56) References Cited

U.S. PATENT DOCUMENTS 4,038,170 A * 7/1977 Rhees ....................... C25B 1/34
204/290.03
2004/0071864 A1    4/2004 Yao et al.
(Continued)

FOREIGN PATENT DOCUMENTS

JP    11-170547 A1    6/1999
JP    11-348277 A1    12/1999
(Continued)

OTHER PUBLICATIONS

European Search Report, European Application No. 13769051.7, dated Sep. 17, 2015 (4 pages).
(Continued)

*Primary Examiner* — J. San Martin
(74) *Attorney, Agent, or Firm* — Burr & Brown, PLLC

(57) ABSTRACT

Provided is a piezoelectric/electrostrictive film type element in which the film thickness of the piezoelectric/electrostrictive film is small, the piezoelectric/electrostrictive film is dense, and the piezoelectric/electrostrictive film has good durability and insulation quality. The piezoelectric/electrostrictive film type element includes a substrate, a lower electrode film, a piezoelectric/electrostrictive film and an upper electrode film. The substrate and the lower electrode film are fixed adherently each other. The film thickness of the piezoelectric/electrostrictive film is 5 μm or less. The piezoelectric/electrostrictive film is composed of a piezoelectric/electrostrictive ceramic. The piezoelectric/electrostrictive ceramic contains lead zirconate titanate and a bismuth compound. The bismuth/lead ratio in the peripheral section inside the grain which is relatively close to the grain
(Continued)

boundary is greater than the bismuth/lead ratio in the center section inside the grain which is relatively far from the grain boundary.

2 Claims, 7 Drawing Sheets

(51) Int. Cl.

| | | |
|---|---|---|
| C04B 35/491 | (2006.01) | |
| H01L 41/314 | (2013.01) | |
| B41J 2/14 | (2006.01) | |
| B41J 2/16 | (2006.01) | |
| H01L 41/08 | (2006.01) | |
| H01L 41/09 | (2006.01) | |
| B32B 18/00 | (2006.01) | |
| C04B 35/622 | (2006.01) | |
| H01L 41/047 | (2006.01) | |
| C04B 35/01 | (2006.01) | |
| C04B 35/499 | (2006.01) | |

(52) U.S. Cl.
CPC ............ *B41J 2/1623* (2013.01); *B41J 2/1629* (2013.01); *B41J 2/1645* (2013.01); *C04B 35/01* (2013.01); *C04B 35/491* (2013.01); *C04B 35/499* (2013.01); *C04B 35/62222* (2013.01); *H01L 41/047* (2013.01); *H01L 41/0805* (2013.01); *H01L 41/0973* (2013.01); *H01L 41/1878* (2013.01); *H01L 41/314* (2013.01); *C04B 2235/3249* (2013.01); *C04B 2235/3298* (2013.01); *C04B 2235/5445* (2013.01); *C04B 2235/6025* (2013.01); *C04B 2235/80* (2013.01); *C04B 2237/345* (2013.01); *C04B 2237/346* (2013.01); *Y10T 29/42* (2015.01)

(58) Field of Classification Search
USPC .......................................... 310/358, 363–366
See application file for complete search history.

(56) References Cited

U.S. PATENT DOCUMENTS

| | | |
|---|---|---|
| 2006/0223244 A1 | 10/2006 | Nihei |
| 2008/0271300 A1 | 11/2008 | Nihei |
| 2009/0236557 A1 | 9/2009 | Hibino et al. |
| 2011/0221826 A1* | 9/2011 | Kobayashi ........... B41J 2/14032 347/68 |
| 2011/0291530 A1* | 12/2011 | Koizumi ............... C01G 21/006 310/359 |
| 2014/0292159 A1* | 10/2014 | Takemura ................ B41J 2/161 310/366 |

FOREIGN PATENT DOCUMENTS

| | | |
|---|---|---|
| JP | 2004-168637 A1 | 6/2004 |
| JP | 2006-199580 A1 | 8/2006 |
| JP | 2006-298747 A1 | 11/2006 |
| JP | 2009-221096 A1 | 10/2009 |
| JP | 2011-029537 A1 | 2/2011 |
| JP | 2011-251861 A1 | 12/2011 |

OTHER PUBLICATIONS

International Preliminary Report on Patentability (Application No. PCT/JP2013/059176) dated Oct. 9, 2014 (with English translation).
International Search Report (Application No. PCT/JP2013/059176) dated Jun. 18, 2013.

* cited by examiner

F I G . 6
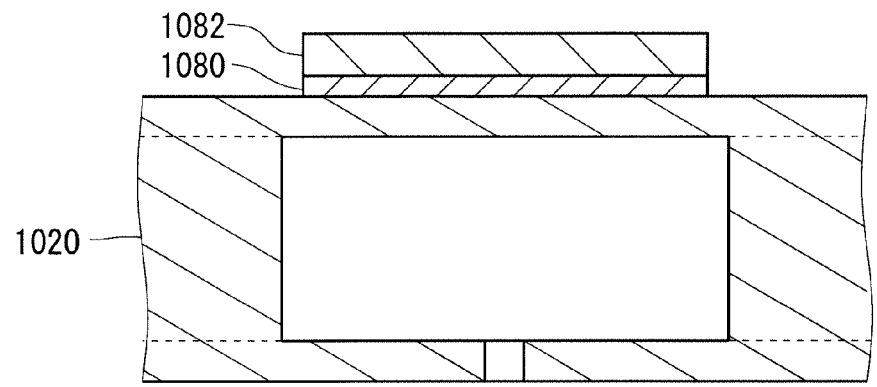
F I G . 7
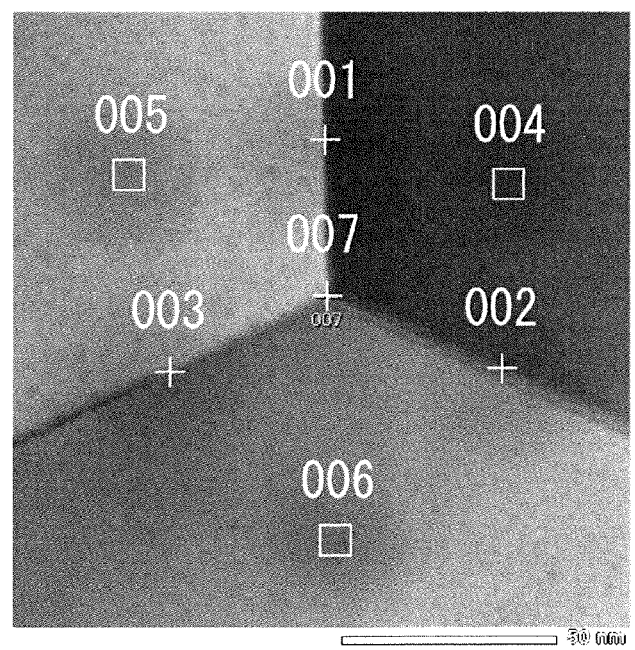

F I G . 1 0
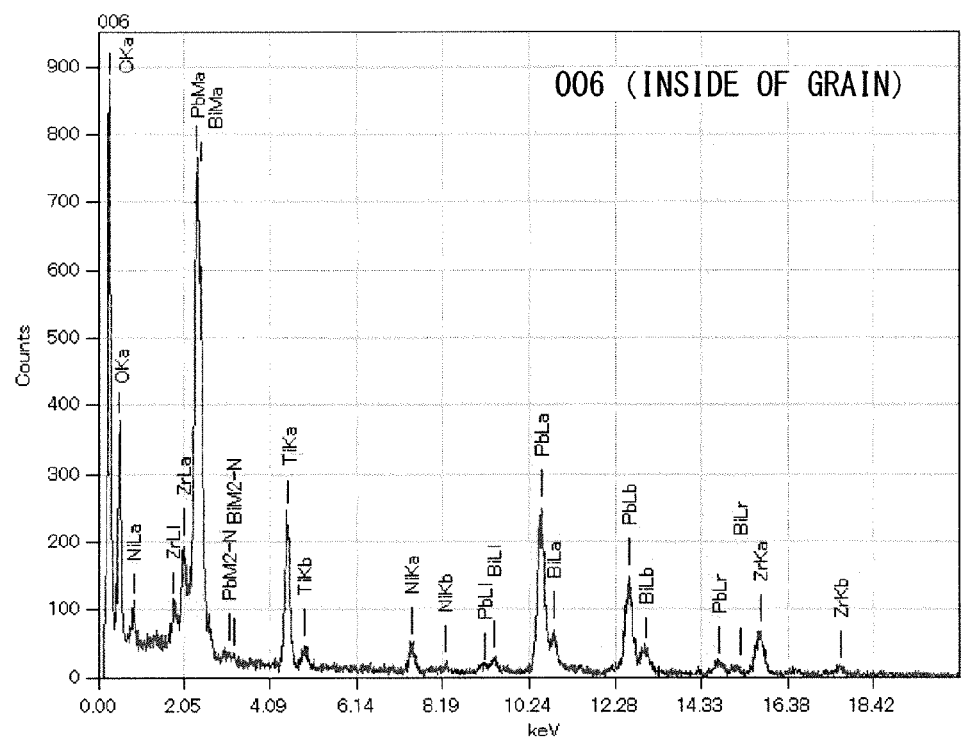
F I G . 1 1
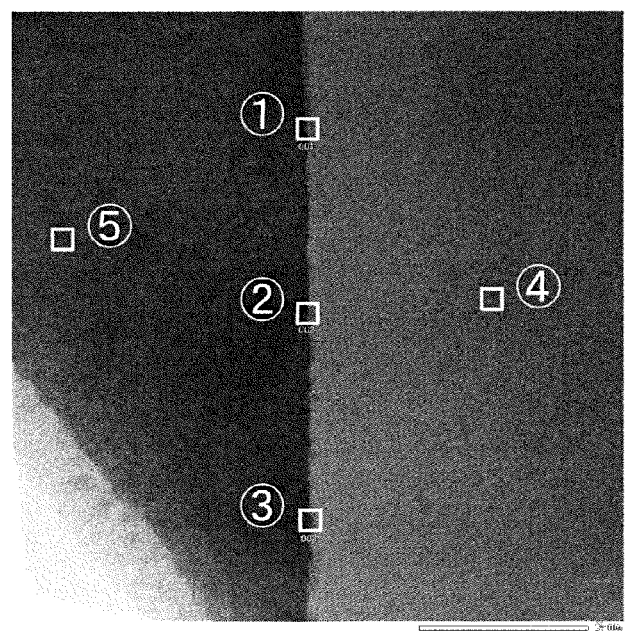

PIEZOELECTRIC/ELECTROSTRICTIVE FILM TYPE ELEMENT CONTAINING LEAD ZIRCONATE TITANATE AND A BISMUTH COMPOUND AND METHOD FOR PRODUCING THE SAME

BACKGROUND OF THE INVENTION

1. Field of the Invention

The present invention relates to a piezoelectric/electrostrictive film type element and a method for producing a piezoelectric/electrostrictive film type element.

2. Description of Related Art

Patent Document 1 discloses a piezoelectric/electrostrictive ceramic composition containing lead zirconate titanate and a composite perovskite compound. The A site constituent element of the composite perovskite compound is bismuth. The piezoelectric/electrostrictive ceramic composition in Patent Document 1 decreases the firing temperature.

Patent Documents 2 and 3 disclose sintering aids. Patent Document 2 shows lead oxide, bismuth carbonate and the like as examples of the sintering aid. Patent Document 3 shows bismuth oxide as an example of the sintering aid. According to Patent Document 2, the amount of lead, bismuth and the like at the grain boundary is greater than the amount of lead, bismuth and the like inside the grain. According to Patent Document 3, bismuth oxide is solid-dissolved inside the grain. The sintering aids in Patent Documents 2 and 3 decrease the firing temperature.

PRIOR ART DOCUMENTS

Patent Documents

Patent Document 1: Japanese Patent Application Laid-Open No. 2009-221096
Patent Document 2: Japanese Patent Application Laid-Open No. 11-170547 (1999)
Patent Document 3: Japanese Patent Application Laid-Open No. 2011-29537

SUMMARY OF THE INVENTION

Problems to be Solved by the Invention

In a piezoelectric/electrostrictive film type element and or the like that forms a head of an inkjet printer, a vibrator including a lower electrode film, a piezoelectric/electrostrictive film and an upper electrode film is often fixed adherently on a surface of a substrate. Therefore, the piezoelectric/electrostrictive film is restrained by the substrate. When the piezoelectric/electrostrictive film is restrained by the substrate, firing shrinkage of the piezoelectric/electrostrictive film is hindered, so that it is difficult to decrease the firing temperature. This problem becomes more significant as the film thickness of the piezoelectric/electrostrictive film decreases. When it is difficult to decrease the firing temperature, it is difficult to densify the piezoelectric electrostrictive film.

On the other hand, when a sintering aid is added for decreasing the firing temperature, durability and insulation quality of the piezoelectric/electrostrictive film are deteriorated.

That is, in the conventional technique, it is difficult to provide a piezoelectric/electrostrictive film type element in which the film thickness of the piezoelectric/electrostrictive film is small, the piezoelectric/electrostrictive film is dense, and the piezoelectric/electrostrictive film has good durability and insulation quality.

The present invention is made to solve this problem. An object of the present invention is to provide a piezoelectric/electrostrictive film type element in which the film thickness of the piezoelectric/electrostrictive film is small, the piezoelectric/electrostrictive film is dense, and the piezoelectric/electrostrictive film has good durability and insulation quality.

Means for Solving the Problems

The present invention is directed to a piezoelectric/electrostrictive film type element.

The piezoelectric/electrostrictive film type element includes a base, a first electrode film, a piezoelectric/electrostrictive film and a second electrode film. The first electrode film is formed on a first main surface of the piezoelectric/electrostrictive film. The second electrode film is formed on a second main surface of the piezoelectric/electrostrictive film. The first electrode film and the piezoelectric/electrostrictive film are fixed adherently each other. The first electrode film covers a region to be covered of the base. The film thickness of the piezoelectric/electrostrictive film is 5 μm or less. The piezoelectric/electrostrictive film is composed of a piezoelectric/electrostrictive ceramic. The piezoelectric/electrostrictive ceramic contains lead zirconate titanate and a bismuth compound. The bismuth/lead ratio in the peripheral section inside the grain which is relatively close to the grain boundary is greater than the bismuth/lead ratio in the center section inside the grain which is relatively far from the grain boundary.

The present invention is also directed to a method for producing a piezoelectric/electrostrictive film type element.

A base is provided. A region to be covered of the base is covered with a first electrode film. A film-shaped formed body of a raw material powder of a piezoelectric/electrostrictive ceramic is formed over the first electrode film. The raw material powder is a mixture of a calcined powder containing lead zirconate titanate and a bismuth compound, a powder of an oxide of lead or a precursor of an oxide of lead and a powder of an oxide of bismuth or a precursor of an oxide of bismuth. The base, the first electrode film and the film-shaped formed body are co-fired. The film-shaped formed body changes into a film-shaped sintered body. The film thickness of the film-shaped sintered body is 5 μm or less. A piezoelectric/electrostrictive film is formed from the film-shaped sintered body. A second electrode film is formed over the piezoelectric/electrostrictive film.

Effects of the Invention

According to the present invention, there is provided a piezoelectric/electrostrictive film type element in which the film thickness of the piezoelectric/electrostrictive film is small, the piezoelectric/electrostrictive film is dense, and the piezoelectric/electrostrictive film has good durability and insulation quality.

These and other objects, features, aspects and advantages of the present invention will be more apparent from the following detailed descriptions of the present invention with reference to the accompanying drawings.

BRIEF DESCRIPTION OF DRAWINGS

FIG. 6 is a cross sectional view showing process for producing a piezoelectric/electrostrictive film type element.

FIG. 7 is a transmission electron microscope photographic image in Example 1.

FIG. 10 is a view showing an EDX spectrum inside the grain in Example 1.

FIG. 11 is a transmission electron microscope photographic image in Comparative Example 1.

DESCRIPTION OF EMBODIMENT

This embodiment relates to a piezoelectric/electrostrictive film type element, a method for producing a piezoelectric/electrostrictive film type element, and so on.

(Outline of Piezoelectric/Electrostrictive Film Type Element)

Figure 1:
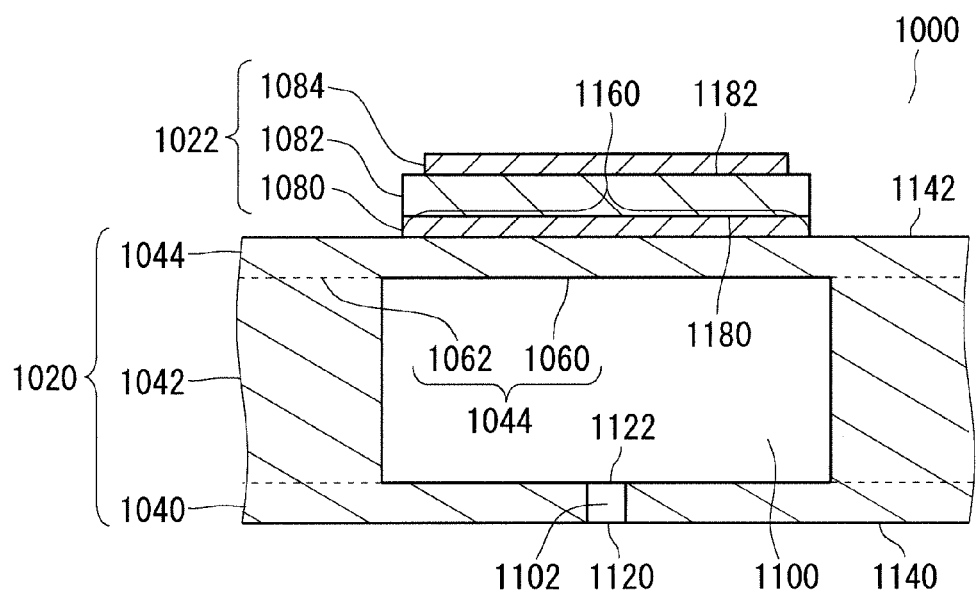
FIG. 1 is a cross sectional view of a piezoelectric/electrostrictive film type element.

The schematic view of FIG. 1 is a cross sectional view of a piezoelectric/electrostrictive film type element.

As shown in FIG. 1, a piezoelectric/electrostrictive film type element 1000 includes a substrate 1020 and a vibrator 1022. The vibrator 1022 is fixed adherently on the substrate 1020. The substrate 1020 includes a channel formation plate 1040, a cavity formation plate 1042 and a vibration plate 1044. The vibration plate 1044 includes a bending vibration section 1060 and a bonding section 1062. The vibrator 1022 includes a lower electrode film 1080, a piezoelectric/electrostrictive film 1082 and an upper electrode film 1084. Components other than these components may be added to the piezoelectric/electrostrictive film type element 1000. The piezoelectric electrostrictive film type element 1000 forms a head of an inkjet printer.

When a voltage is applied between the lower electrode film 1080 and the upper electrode film 1084, an electric filed is applied to the piezoelectric/electrostrictive film 1082. When an electric field is applied to the piezoelectric/electrostrictive film 1082, the piezoelectric/electrostrictive film 1082 expands and contracts, so that the piezoelectric/electrostrictive film 1082 and the bending vibration section 1060 are integrally bent. When the bending vibration section 1060 is bent, an ink poured in a cavity 1100 is pressed, so that the ink is discharged through a channel 1102.

(Structure of Substrate)

In the substrate 1020, the channel formation plate 1040, the cavity formation plate 1042 and the vibration plate 1044 are laminated in this order from the lower side to the upper side. The channel formation plate 1040, the cavity formation plate 1042 and the vibration plate 1044 may be integrated by firing, and therefore may have no clear interface.

The channel 1102 is formed on the channel formation plate 1040. The cavity 1100 is formed on the cavity formation plate 1042. The cavity 1100 is isolated from the outside of the substrate 1020 by the channel formation plate 1040 and the vibration plate 1044, and provides a hollow space formed inside the substrate 1020. The cavity 1100 serves as an ink chamber that is filled with an ink. One end 1120 of the channel 1102 is exposed at a lower surface 1140 of the substrate 1020. The other end 1122 of the channel 1102 is connected to the cavity 1100. An upper surface 1142 of the substrate 1020 has a region 1160 to be covered. The region 1160 to be covered is situated on the upper surface of the bending vibration section 1060. The substrate 1020 may be replaced by a shaped article having a shape far from a "plate". More generally, the vibrator 1022 is fixed adherently on a base.

(Plate Thickness of Vibration Plate)

The plate thickness of the vibration plate 1044 is preferably 1 μm or more. When the plate thickness of the vibration plate 1044 falls below this range, the vibration plate 1044 is easily damaged. The plate thickness of the vibration plate 1044 is preferably 30 μm or less, further preferably 15 μM or less. When the plate thickness of the vibration plate 1044 falls above this range, the bending displacement amount of the vibration plate 1044 easily decreases.

(Material of Substrate)

The substrate 1020 is composed of an insulating ceramic. Preferably, the insulating ceramic contains at least one selected from the group consisting of zirconia, alumina, magnesia, mullite, aluminum nitride and silicon nitride. An insulating ceramic containing these compounds is chemically stable and has good insulation quality. An insulating ceramic which does not contain these compounds is also acceptable.

Further preferably, the insulating ceramic is composed of zirconia containing a stabilizer. Zirconia containing a stabilizer has high mechanical strength and high toughness. Zirconia containing a stabilizer is zirconia in which phase transition of crystals is suppressed by addition of the stabilizer. Zirconia containing a stabilizer includes stabilized zirconia and partially stabilized zirconia.

(Structure of Vibrator)

In the vibrator 1022, the lower electrode film 1080, the piezoelectric/electrostrictive film 1082 and the upper electrode film 1084 are laminated in this order from the lower side to the upper side.

The lower electrode film 1080 is formed on a lower surface 1180 of the piezoelectric/electrostrictive film 1082. The upper electrode film 1084 is formed on an upper surface 1182 of the piezoelectric/electrostrictive film 1082. Hereby, when a voltage is applied between the lower electrode film 1080 and the upper electrode film 1084, an electric filed is applied to the piezoelectric/electrostrictive film 1082.

(Adherent Fixation of Components)

The substrate 1020 and the lower electrode film 1080 are fixed adherently each other. The lower electrode film 1080 and the piezoelectric/electrostrictive film 1082 are fixed adherently each other. Adherent fixation means that one component and the other component are strongly bonded by a mutual diffusion reaction during heat treatment. When one component and the other component are fixed adherently each other, a bonding medium such as an inorganic adhesive or an organic adhesive is not used. Adherent fixation of the substrate 1020 and the lower electrode film 1080 and adherent fixation of the lower electrode film 1080 and the piezoelectric/electrostrictive film 1082 result from co-firing of the substrate 1020, the lower electrode film 1080 and the piezoelectric/electrostrictive film 1082.

(Coverage of Lower Electrode Film)

The lower electrode film 1080 covers the region 1160 to be covered of the substrate 1020. The coverage of the lower electrode film 1080 is preferably 90% or more. When the coverage of the lower electrode film 1080 falls below this range, the electric resistance of the lower electrode film 1080 easily increases.

The coverage of the lower electrode film 1080 means a ratio of an area, which is actually covered with the lower electrode film 1080 after co-firing, to an area of the region 1160 to be covered of the substrate 1020. The coverage of the lower electrode film 1080 is calculated by, for example, processing an image of the lower electrode film 1080.

Decrease of the coverage of the lower electrode film 1080 from 100% results from co-firing of the substrate 1020, the lower electrode film 1080 and the piezoelectric/electrostrictive film 1082. The coverage of the lower electrode film 1080 being 90% or more means that the coverage of the lower electrode film 1080 decreases by 10% or less during co-firing.

(Material of Lower Electrode Film and Upper Electrode Film)

The lower electrode film 1080 and the upper electrode film 1084 are composed of a conductor. The conductor is preferably a metal such as platinum (Pt), palladium (Pd), rhodium (Rh), gold (Au), silver (Ag) or the like, or an alloy containing the aforementioned metal as a main component. Such a material has high heat resistance and low electric resistance. The conductor is further preferably platinum or an alloy containing platinum as a main component. Such a material has particularly high heat resistance. The lower electrode film 1080 is co-fired together with the substrate 1020 and the piezoelectric/electrostrictive film 1082. Therefore, the material of the lower electrode film 1080 is particularly desired to be platinum or an alloy containing platinum as a main component.

(Film Thickness of Lower Electrode Film and Upper Electrode Film)

The film thickness of each of the lower electrode film 1080 and the upper electrode film 1084 is preferably 1 μm or less. When the film thickness of each of the lower electrode film 1080 and the upper electrode film 1084 falls above this range, the bending displacement amount easily decreases. The film thickness of each of the lower electrode film 1080 and the upper electrode film 1084 is preferably 0.1 μm or more. When the film thickness of each of the lower electrode film 1080 and the upper electrode film 1084 falls below this range, the electric resistance of the lower electrode film 1080 easily increases.

(Film Thickness of Piezoelectric/Electrostrictive Film)

The film thickness of the piezoelectric/electrostrictive film 1082 is preferably 5 μm or less. When the film thickness of the piezoelectric/electrostrictive film 1082 falls above this range, stress applied to the bending vibration section 1060 easily increases by firing shrinkage. The film thickness of the piezoelectric/electrostrictive film 1082 is preferably 1 μm or more. When the film thickness of the piezoelectric/electrostrictive film 1082 falls below this range, the piezoelectric/electrostrictive film 1082 is hard to be densified.

(Material of Piezoelectric/Electrostrictive Film)

The piezoelectric/electrostrictive film 1082 is composed of a piezoelectric/electrostrictive ceramic.

The piezoelectric/electrostrictive ceramic contains lead zirconate titanate (PZT; $PbZr_xTi_{1-x}O_3$) and a bismuth compound. The bismuth compound is preferably bismuth nickel niobate (BNN; $Bi(Ni_{2/3}Nb_{1/3})O_3$). BNN contributes to low-temperature firing of the piezoelectric/electrostrictive ceramic and improvement of the piezoelectric constant.

The piezoelectric/electrostrictive ceramic may contain components other than PZT and a bismuth compound. Components other than PZT and a bismuth compound include a simple oxide and a composite oxide. The composite oxide may be a composite perovskite oxide. The components other than PZT may be solid-dissolved in PZT, or may not be solid-dissolved in PZT. A segregated matter that is not solid-dissolved in PZT may exist at the grain boundary, or may be surrounded by one grain. The components other than PZT may be a trace matter of a sintering aid.

The parent phase of the piezoelectric/electrostrictive ceramic is further preferably a solid solution of PZT and BNN. The piezoelectric/electrostrictive ceramic also contains a trace matter of PbO and $Bi_2O_3$ as the sintering aid. The parent phase means a phase that foil is grains constituting a principal part of the piezoelectric/electrostrictive ceramic.

(Microstructure of Piezoelectric/Electrostrictive Ceramic)

In the piezoelectric/electrostrictive ceramic, the bismuth/lead ratio in the peripheral section inside the grain which is relatively close to the grain boundary is greater than the bismuth/lead ratio in the center section inside the grain which is relatively far from the grain boundary. When the piezoelectric/electrostrictive ceramic is produced so as to have this microstructure, the firing temperature decreases, while durability and insulation quality of the piezoelectric/electrostrictive film 1082 are kept satisfactory. A decrease in firing temperature makes it easy to reduce the film thickness of the piezoelectric/electrostrictive film 1082, makes it easy to reduce the film thickness of the lower electrode film 1080, and makes it easy to keep the coverage of the lower electrode film 1080 at 90% or more.

(Method for Producing Piezoelectric/Electrostrictive Film Type Element)

Schematic views of FIGS. 2 to 6 are cross sectional views showing a method for producing a piezoelectric/electrostrictive film type element.

(Preparation of Substrate)

Figure 2:
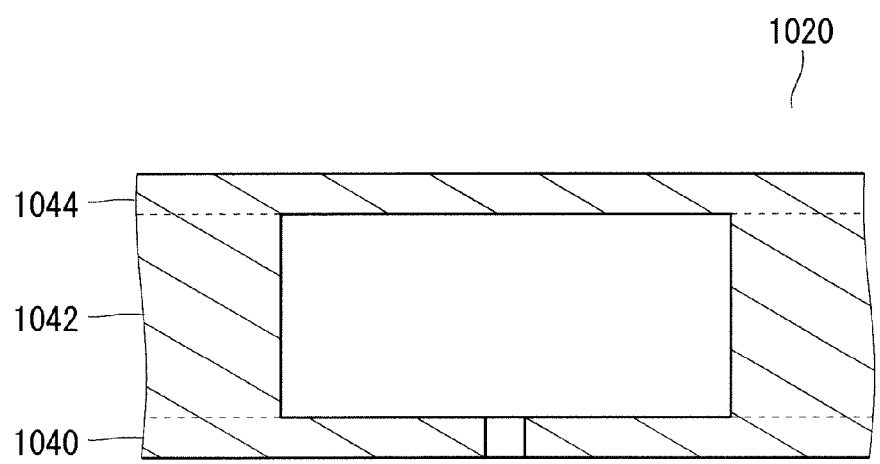
FIG. 2 is a cross sectional view showing process for producing a piezoelectric/electrostrictive film type element.

As shown in FIG. 2, the substrate 1020 is prepared. When the substrate 1020 is prepared, formed bodies, which finally form the channel formation plate 1040, the cavity formation plate 1042 and the vibration plate 1044, are laminated and fired. The substrate 1020 may be prepared by another method. For example, a blank substrate may be subjected to etching, cutting processing or the like to prepare the substrate 1020.

(Formation of Lower Electrode Film)

Figure 3:
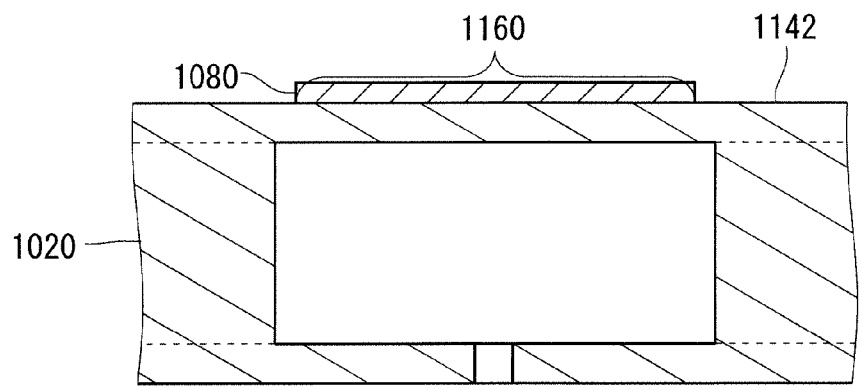
FIG. 3 is a cross sectional view showing process for producing a piezoelectric/electrostrictive film type element.

After the substrate 1020 is provided, the lower electrode film 1080 is formed as shown in FIG. 3.

When the lower electrode film 1080 is formed, a lower conductor film is formed on the upper surface 1142 of the substrate 1020 by vapor deposition, sputtering, plating, screen printing or the like. The lower conductor film is patterned to form the lower electrode film 1080. When the lower conductor film does not protrude from the region 1160 to be covered, patterning of the lower conductor film may be omitted. In this case, the formed lower conductor film itself is the lower electrode film 1080. In the cases where vapor deposition, sputtering or the like is performed using a mask, where screen printing is performed using a screen printing plate, and the like, the lower conductor film may not protrude from the region 1160 to be covered. The film thickness of the lower conductor film is selected such that the film thickness of the lower electrode film 1080 is 1 μm or less.

The lower conductor film is patterned by a resist method. For example, areas other than the region 1160 to be covered are protected with a resist pattern before the lower conductor film is formed, and the resist pattern, and areas of the lower conductor film which are superimposed on the resist pattern are removed after the lower conductor film is formed. Alternatively, after the lower conductor film is formed, the region 1160 to be covered is protected with a resist pattern, areas of the lower conductor film which are not protected with the resist pattern are removed, and the resist pattern is removed. The lower conductor film may be patterned by a method other than the resist method.

(Formation of Film-Shaped Formed Body)

Figure 4:
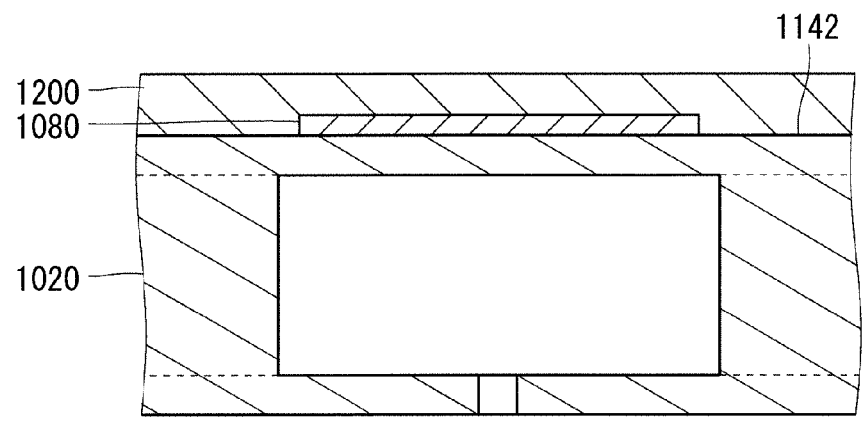
FIG. 4 is a cross sectional view showing process for producing a piezoelectric/electrostrictive film type element.

After the lower electrode film 1080 is formed, a film-shaped formed body 1200 of a raw material powder of the piezoelectric/electrostrictive ceramic is formed on the upper surface 1142 of the substrate 1020 as shown in FIG. 4. The film-shaped formed body 1200 is formed over the lower electrode film 1080. The raw material powder is a mixture of a calcined powder and a sintering aid. The calcined powder includes lead zirconate titanate and a bismuth compound. In the calcined powder, starting raw materials are reacted until a perovskite type oxide of a solid solution of lead zirconate titanate and a bismuth compound becomes a main component. The sintering aid includes a powder of PbO and a powder of $Bi_2O_3$. The film thickness of the film-shaped formed body 1200 is selected such that the film thickness of the later-described film-shaped sintered body 1220 is 5 μm or less. PbO may be replaced by an oxide of lead other than PbO. For example, PbO may be replaced by $PbO_2$, $Pb_3O_4$ or the like. PbO may be replaced by a precursor of an oxide of lead, which forms an oxide of lead after firing. Examples of the precursor of an oxide of lead include hydroxides, chlorides, carbonates and oxalates. $Bi_2O_3$ may be replaced by an oxide of bismuth other than $Bi_2O_3$. For example, $Bi_2O_3$ may be replaced by $Bi_2O_5$ or the like. $Bi_2O_3$ may be replaced by a precursor of an oxide of bismuth, which forms an oxide of bismuth after firing. Examples of the precursor of an oxide of bismuth include hydroxides, chlorides, carbonates and oxalates.

When the film-shaped formed body 1200 is formed, a slurry is prepared. In the slurry, a raw material powder is dispersed in a dispersion medium. The slurry is applied to the upper surface 1142 of the substrate 1020 by spin coating, dipping, spraying, screen printing or the like to form a coating film. The coating film is dried to form the film-shaped formed body 1200.

(Co-Firing)

Figure 5:
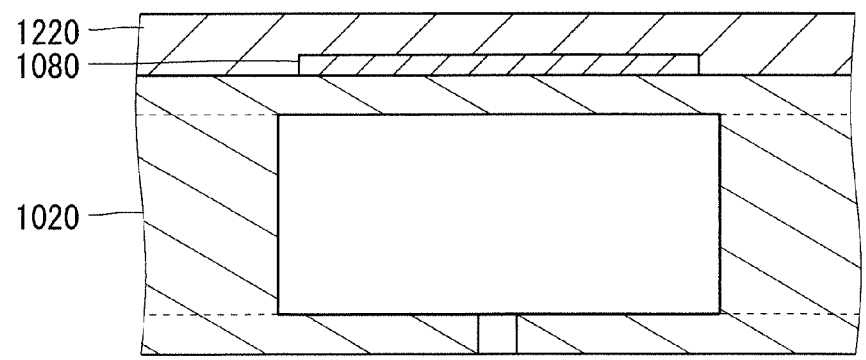
FIG. 5 is a cross sectional view showing process for producing a piezoelectric/electrostrictive film type element.

After the film-shaped formed body 1200 is formed, the substrate 1020, the lower electrode film 1080 and the film-shaped formed body 1200 are co-fired. Co-firing causes the film-shaped formed body 1200 to change into the film-shaped sintered body 1220 as shown in FIG. 5. By co-firing, the substrate 1020 and the lower electrode film 1080 are fixed adherently each other, and the lower electrode film 1080 and the film-shaped sintered body 1220 are fixed adherently each other. The film-shaped formed body 1200 is restrained by the substrate 1020. Accordingly, in-plane shrinkage of the film-shaped formed body 1200 is hindered. However, since the raw material powder contains a sintering aid, the film-shaped sintered body 1220 is sufficiently densified even when in-plane shrinkage is hindered.

Firing conditions are selected such that the coverage of the lower electrode film 1080 is kept at 90% or more. Since the raw material powder contains a sintering aid, the film-shaped sintered body 1220 is sufficiently densified even when the firing temperature is decreased so that the coverage of the lower electrode film 1080 is kept high.

PbO as a sintering aid is evaporated during co-firing, so that the film-shaped sintered body 1220, in which the bismuth/lead ratio in the peripheral section inside the grain is greater than the bismuth/lead ratio in the center section inside the grain, is obtained. Therefore, durability and insulation quality of the film-shaped sintered body 1220 is high although a sintering aid is added. Co-firing is performed under such conditions that PbO is evaporated, and remaining $Bi_2O_3$ diffuses inside the grain, but does not diffuse enough to be completely uniformly distributed inside the grain. The film-shaped sintered body 1220 is hereby provided with a microstructure in which the bismuth/lead ratio in the peripheral section inside the grain is greater than the bismuth/lead ratio in the center section inside the grain.

(Patterning of Film-Shaped Sintered Body)

After co-firing, the film-shaped sintered body 1220 is patterned to form the piezoelectric/electrostrictive film 1082 as shown in FIG. 6. When the film-shaped formed body 1200 does not significantly protrude from the region 1160 to be covered, patterning of the film-shaped sintered body 1220 may be omitted. In this case, the formed film-shaped sintered body 1220 itself is the piezoelectric/electrostrictive film 1082. The film-shaped formed body 1200 may not significantly protrude from the region 1160 to be covered when screen printing is performed using a screen printing plate, or the like.

The film-shaped sintered body 1220 is patterned by a resist method. For example, after the film-shaped sintered body 1220 is formed, the region 1160 to be covered is protected with a resist pattern, areas of the film-shaped sintered body 1220 which are not protected with the resist pattern are removed, and the resist pattern is removed. The film-shaped sintered body 1220 may be patterned by a method other than the resist method.

(Formation of Upper Electrode Film)

After the piezoelectric/electrostrictive film 1082 is formed, the upper electrode film 1084 is formed on the upper surface 1182 of the piezoelectric/electrostrictive film 1082 to complete piezoelectric/electrostrictive film type element 1000 shown in FIG. 1. When the upper electrode film 1084 is formed, an upper conductor film is formed on the upper surface 1142 of the substrate 1020 by vapor deposition, sputtering, plating, screen printing or the like. The upper conductor film is formed over the lower electrode film 1080 and the piezoelectric/electrostrictive film 1082. The upper conductor film is patterned to form the upper electrode film 1084. When the upper conductor film is formed without protruding from the upper surface 1182 of the piezoelectric/electrostrictive film 1082, patterning of the upper conductor film may be omitted. In this case, the formed upper conductor film itself is the upper electrode film 1084. In the cases where vapor deposition, sputtering or the like is performed using a mask, where screen printing is performed using a screen printing plate, and the like, the upper conductor film may not protrude from the upper surface 1182 of the piezoelectric/electrostrictive film 1082.

The upper conductor film is patterned by a resist method. For example, areas other than the upper surface 1182 of the piezoelectric/electrostrictive film 1082 are protected with a resist pattern before the upper conductor film is formed, and the resist pattern, and areas of the upper conductor film which are superimposed on the resist pattern are removed after the upper conductor film is formed. Alternatively, after the upper conductor film is formed, the upper surface 1182 of the piezoelectric/electrostrictive film 1082 is protected with a resist pattern, areas of the upper conductor film which are not protected with the resist pattern are removed, and the resist pattern is removed. The upper conductor film may be patterned by a method other than the resist method.

EXAMPLES

Example 1

A piezoelectric/electrostrictive film type element was experimentally produced.

A raw material powder of partially stabilized zirconia was tape-casted to prepare a green sheet. The green sheet was punched. The green sheets were laminated to prepare a green sheet laminate. The green sheet laminated was fired to prepare a substrate.

A conductor film was formed on the upper surface of the substrate. The material of the conductor film was platinum. The film thickness of the conductor film was 0.5 μm. The conductor film was patterned by a resist method to form a lower electrode film.

A calcined powder having the composition: 0.2 BNN-0.8 PZT was synthesized by a solid phase method. The particle size of the calcined powder was 0.15 μm. The calcined powder, a powder of PbO, a powder of $Bi_2O_3$, a dispersant, a binder and a dispersion medium were wet-mixed to prepare a slurry. In wet mixing, the calcined powder, the powder of PbO and the powder of $Bi_2O_3$ were weighed such that 3 parts by weight of PbO and 1 part by weight of $Bi_2O_3$ were included based on 100 parts by weight of the calcined powder.

The upper surface of the substrate was spin-coated with the slurry to form a coating film. The coating film was dried to form a film-shaped formed body. The film thickness of the film-shaped formed body was selected such that the film thickness of a film-shaped sintered body was 3 μm.

After debindering was performed, the substrate, the lower electrode film and the film-shaped formed body were co-fired. Co-firing was performed using a firing profile of keeping the maximum temperature of 1000° C. for 2 hours.

A resist pattern was formed using a positive resist. Areas of the film-shaped sintered body which were not protected with the resist pattern were removed with a PZT etchant to form a piezoelectric/electrostrictive film.

An upper electrode film was formed on the upper surface of the piezoelectric/electrostrictive film. The film thickness of the upper electrode film was 0.1 μm. The material of the upper electrode film was gold. The upper electrode film was formed by a resist method using a gold resonate.

Example 2

A piezoelectric/electrostrictive film type element was experimentally produced in the same manner as in Example 1 except that a calcined powder, a powder of PbO and a powder of $Bi_2O_3$ were weighed such that 3 parts by weight of PbO and 0.5 parts by weight of $Bi_3O_2$ were included based on 100 parts by weight of the calcined powder.

Example 3

A piezoelectric/electrostrictive film type element was experimentally produced in the same manner as in Example 1 except that a calcined powder, a powder of PbO and a powder of $Bi_2O_3$ were weighed such that 2 parts by weight of PbO and 0.3 parts by weight of $Bi_2O_3$ were included based on 100 parts by weight of the calcined powder, and the maximum temperature in the firing profile was changed to 1050° C.

Comparative Example 1

A piezoelectric/electrostrictive film type element was experimentally produced in the same manner as in Example 1 except that LiF was used as a sintering aid.

Comparative Example 2

A piezoelectric/electrostrictive film type element was experimentally produced in the same manner as in Example 1 except that PbO was used as a sintering aid.

(Durability)

A durability test in which the piezoelectric/electrostrictive film type element in each of Examples 1, 2 and 3 and Comparative Examples 1 and 2 was placed under an environment of 40° C. and 85% RH, and a direct-current voltage of 50 V was applied between the upper electrode film and the lower electrode film for 80 hours was conducted. A piezoelectric/electrostrictive film type element which had not suffered insulation breakdown was rated acceptable.

In Examples 1, 2 and 3, all of 300 piezoelectric/electrostrictive film type elements were acceptable. In Comparative Examples 1 and 2, all of 300 piezoelectric/electrostrictive film type elements were unacceptable.

(Insulation Quality)

A leak current that flowed when applying a direct-current voltage of 100 V between the upper electrode and lower electrode films was measured.

In Examples 1, 2 and 3, the leak current was $10^{-7}$ A. In Comparative Examples 1 and 2, the leak current was $10^{-5}$ A.

(Microstructure)

Figure 8:
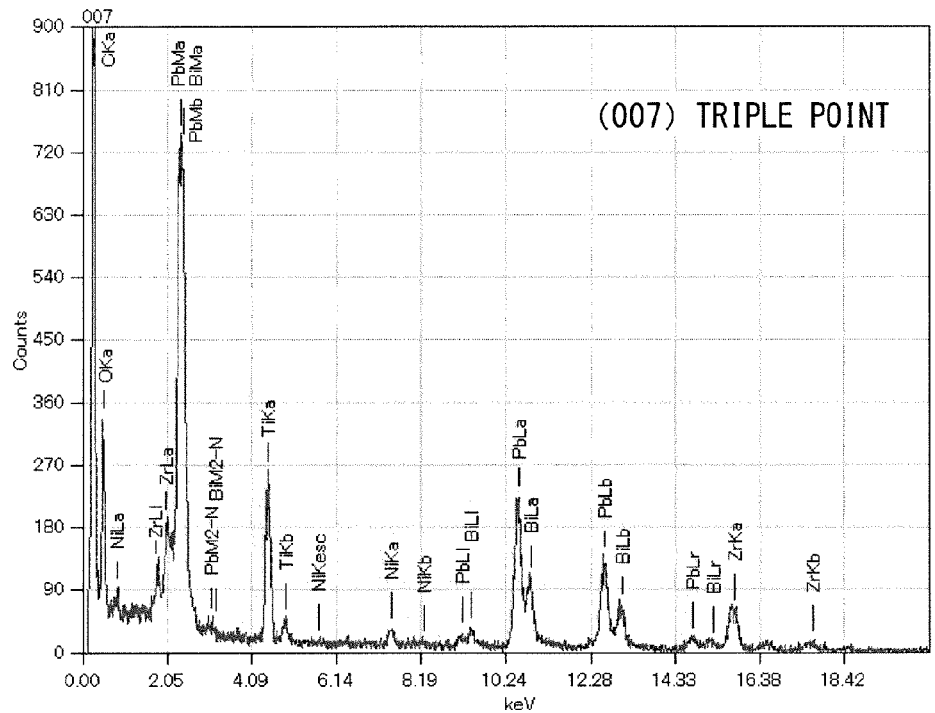
FIG. 8 is a view showing an EDX spectrum of a triple point in Example 1.
Figure 9:
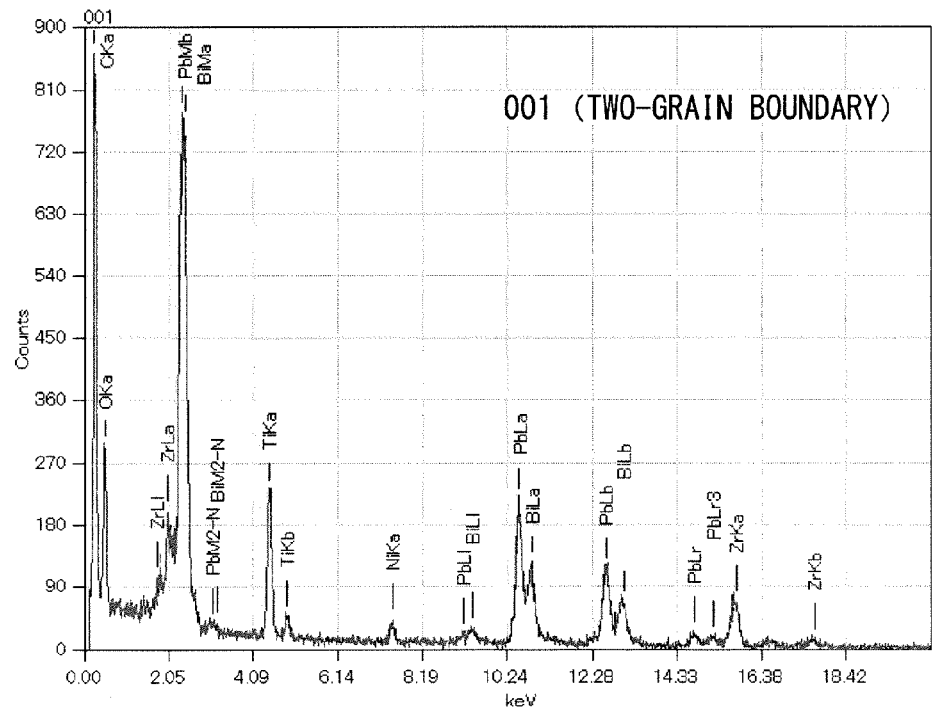
FIG. 9 is a view showing an EDX spectrum of a two-grain boundary in Example 1.
Figure 12:
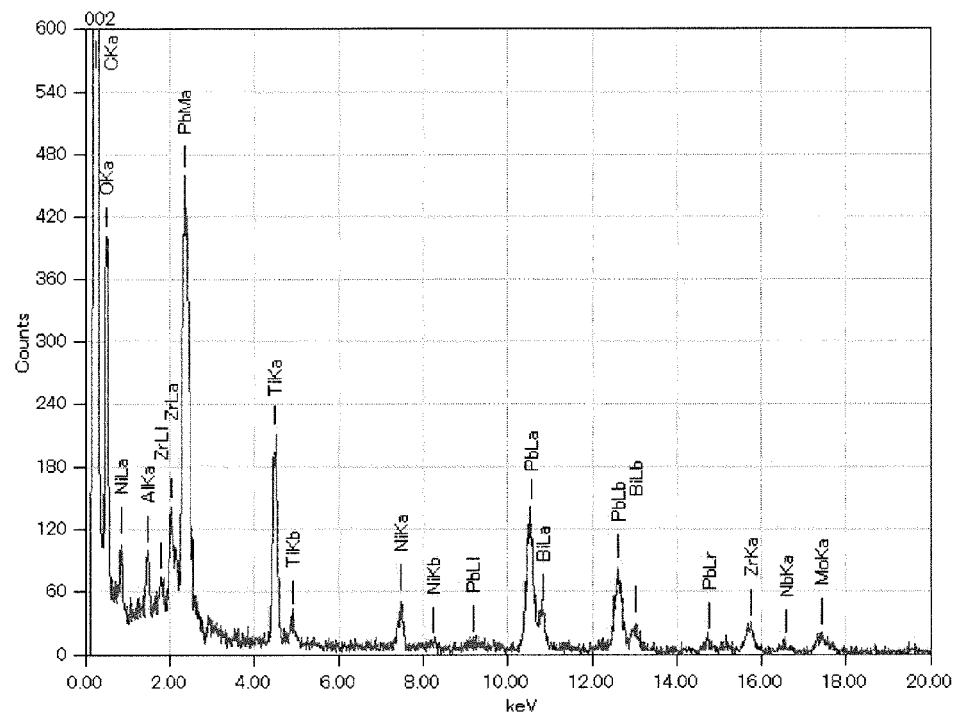
FIG. 12 is a view showing an EDX spectrum of a two-grain boundary in Comparative Example 1.
Figure 13:
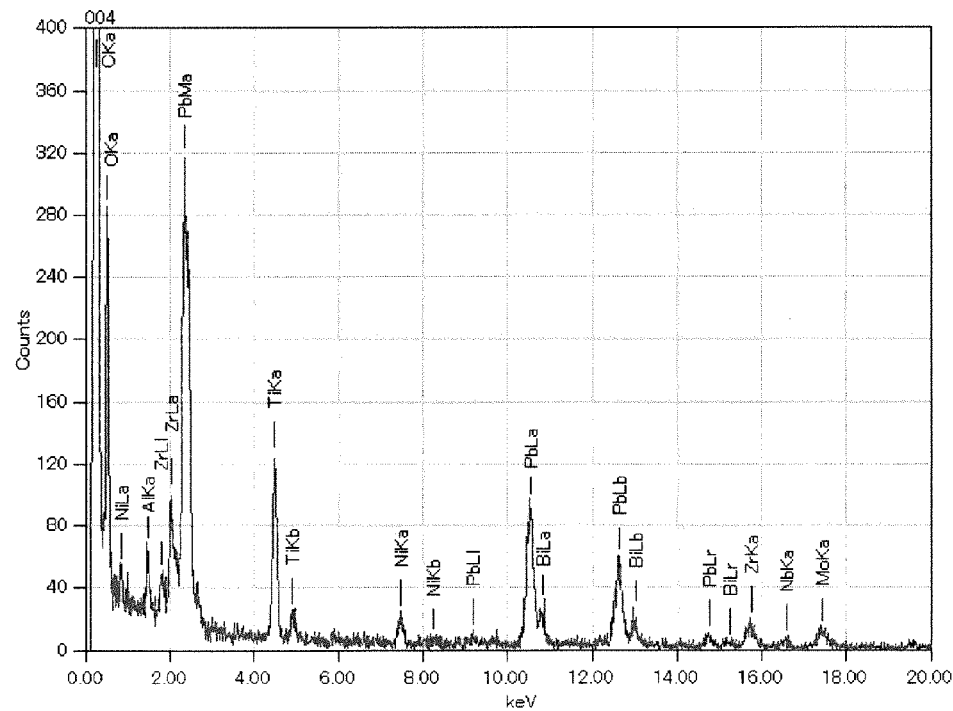
FIG. 13 is a view showing an EDX spectrum inside the grain in Comparative Example 1.

FIG. 7 is a transmission electron microscope photographic (TEM) image of the piezoelectric/electrostrictive ceramic in Example 1. FIG. 8 is a view showing an energy dispersive X-ray analysis (EDX) spectrum of a triple point of the piezoelectric/electrostrictive ceramic in Example 1. FIG. 9 is a view showing an EDX spectrum of the two-grain boundary of the piezoelectric/electrostrictive ceramic in Example 1. FIG. 10 is a view showing an EDX spectrum of the inside of the grain of the piezoelectric/electrostrictive ceramic in Example 1. FIG. 11 is a TEM image of the piezoelectric/electrostrictive ceramic in Comparative Example 1. FIG. 12 is a view showing an EDX spectrum of the two-grain boundary of the piezoelectric/electrostrictive ceramic in Comparative Example 1. FIG. 13 is a view showing an EDX spectrum of the inside of the grain of the piezoelectric/electrostrictive ceramic in Comparative Example 1.

As shown in FIGS. 7 to 13, in the piezoelectric/electrostrictive ceramic in Example 1, the bismuth/lead ratio in the peripheral section inside the grain is greater than the bismuth/lead ratio in the center section inside the grain. In contrast, in the piezoelectric/electrostrictive ceramic in Comparative Example 1, little bismuth exists in the peripheral section inside the grain. In the piezoelectric/electrostrictive ceramic in Comparative Example 2, the bismuth/lead ratio in the peripheral section inside the grain is predicted to be smaller than the bismuth/lead ratio in the center section inside the grain because the sintering aid does not contain $Bi_2O_3$.

Figure 14:
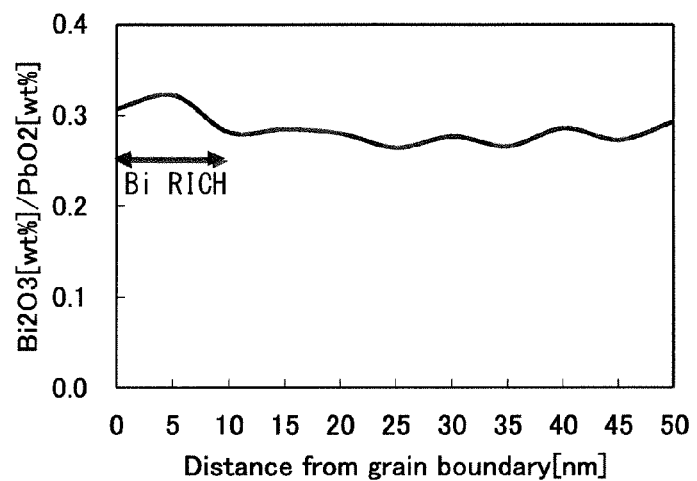
FIG. 14 is a view showing a relationship between a distance from the grain boundary and a bismuth/lead ratio in Example 1.
Figure 15:
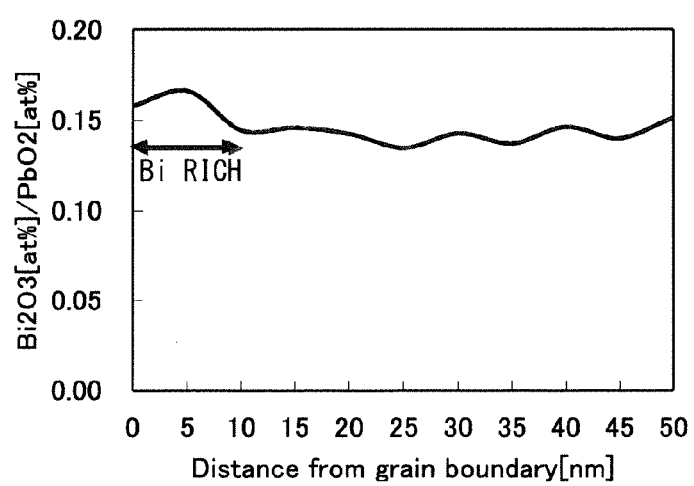
FIG. 15 is a view showing a relationship between a distance from the grain boundary and a bismuth/lead ratio in Example 1.

In the piezoelectric/electrostrictive ceramic in each of Examples 1, 2 and 3, a bismuth/lead ratio at a measurement point was measured by EDX while the distance between the grain boundary and the measurement point was changed by 5 nm each time. FIGS. 14 and 15 show a relationship between a distance from the grain boundary and a bismuth/lead ratio in Example 1. In FIG. 14, the bismuth/lead ratio is shown in terms of a weight ratio. In FIG. 15, the bismuth/lead ratio is shown in terms of an atom number ratio. As shown in FIGS. 14 and 15, in Example 1, the bismuth/lead ratio in the peripheral section inside the grain was greater than the bismuth/lead ratio in the center section inside the grain in a region where the distance from the grain boundary is from 5 nm to 10 nm. In Example 2, the bismuth/lead ratio in the peripheral section inside the grain was greater than the bismuth/lead ratio in the center section inside the grain in a region where the distance from the grain boundary is from 0 nm to 5 nm. In Example 3, the bismuth/lead ratio in the peripheral section inside the grain was greater than the bismuth/lead ratio in the center section inside the grain in a region where the distance from the grain boundary is from 5 nm to 10 nm. It may be desirable that the bismuth/lead ratio in the peripheral section inside the grain where the distance from the grain boundary is from 0 nm to 10 nm be greater than the bismuth/lead ratio in the center section inside the grain where the distance from the grain boundary is 10 nm or more.

From the result of observation of the TEM image, it has been found that a lattice image is not disordered even in a region with a large bismuth/lead ratio. From this fact and the fact that the B site components are the same at the peripheral section inside the grain and the center section inside the grain, the peripheral section inside the grain may form a perovskite phase rather than an amorphous phase.

While the present invention has been shown and described in detail, the above descriptions are illustrative and are not restrictive in all aspects. Therefore, it is understood that infinite modifications and alterations can be made without departing from the scope of the present invention.

The present invention can also be applied to piezoelectric/electrostrictive elements other than piezoelectric/electrostrictive film type elements that foil heads of inkjet printers.

DESCRIPTION OF REFERENCE SIGNS

1000 Piezoelectric/electrostrictive film type element
1020 Substrate
1080 Lower electrode film
1082 Piezoelectric/electrostrictive film
1084 Upper electrode film

The invention claimed is:

1. A piezoelectric/electrostrictive film type element comprising:
   a base having a region to be covered;
   a first electrode film fixed adherently on said base and covering said region to be covered;
   a piezoelectric/electrostrictive film having a first main surface and a second main surface, wherein said first electrode film is formed on said first main surface, the piezoelectric/electrostrictive film is fixed adherently on said first electrode film, has a film thickness of 5 µm or less, and is composed of a piezoelectric/electrostrictive ceramic, said piezoelectric/electrostrictive ceramic contains lead zirconate titanate and a bismuth compound, and a bismuth/lead ratio in a peripheral section inside a grain which is relatively close to a grain boundary is greater than a bismuth/lead ratio in a center section inside the grain which is relatively far from the grain boundary; and
   a second electrode film formed on said second main surface.

2. The piezoelectric/electrostrictive film type element according to claim 1, wherein the parent phase of said piezoelectric/electrostrictive ceramic is a solid solution of lead zirconate titanate and bismuth nickel niobate.

* * * * *